US012632626B1

(12) United States Patent
Deng et al.

(10) Patent No.: US 12,632,626 B1
(45) Date of Patent: May 19, 2026

(54) METHOD OF DIE INTERFACE MODELING FOR CONCURRENT MULTI-DIE IMPLEMENTATION OF THREE-DIMENSIONAL INTEGRATED CIRCUIT (3D-IC)

(71) Applicant: Cadence Design Systems, Inc., San Jose, CA (US)

(72) Inventors: Liqun Deng, Shanghai (CN); Hanqi Yang, Shanghai (CN); Pinhong Chen, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 696 days.

(21) Appl. No.: 17/977,866

(22) Filed: Oct. 31, 2022

Related U.S. Application Data

(60) Provisional application No. 63/369,657, filed on Jul. 27, 2022.

(51) Int. Cl.
  *G06F 30/31* (2020.01)
  *G06F 30/33* (2020.01)

(52) U.S. Cl.
  CPC .............. *G06F 30/31* (2020.01); *G06F 30/33* (2020.01)

(58) Field of Classification Search
  CPC ................................. G06F 30/31; G06F 30/33
  See application file for complete search history.

(56) References Cited

U.S. PATENT DOCUMENTS

| | | | |
|---|---|---|---|
| 7,526,739 | B2 | 4/2009 | Mcilrath |
| 8,032,857 | B2 | 10/2011 | Mcilrath |
| 8,209,649 | B2 | 6/2012 | Mcilrath |
| 8,266,560 | B2 | 9/2012 | Mcilrath |
| 8,543,952 | B2 | 9/2013 | Kariat et al. |
| 8,650,516 | B2 | 2/2014 | Mcilrath |
| 8,832,608 | B1 | 9/2014 | Chakrabarty et al. |
| 9,275,185 | B2 | 3/2016 | Mcilrath |
| 9,552,454 | B2 | 1/2017 | Chowdhury et al. |
| 9,640,279 | B1 | 5/2017 | Popps et al. |
| 9,940,260 | B1 | 4/2018 | Hughes et al. |
| 10,496,777 | B1 * | 12/2019 | Venkatakrishnan .... G06F 30/39 |
| 10,747,929 | B1 * | 8/2020 | Fraisse ................... G06F 30/36 |
| 10,825,745 | B1 | 11/2020 | Sinha et al. |
| 11,120,191 | B2 * | 9/2021 | Xu ......................... G06F 30/392 |
| 11,276,677 | B1 * | 3/2022 | Deng ..................... H10D 89/10 |
| 2008/0184184 | A1 | 7/2008 | Mccracken et al. |
| 2010/0199236 | A1 * | 8/2010 | Chen ..................... H01L 23/481 716/103 |
| 2011/0055791 | A1 | 3/2011 | Gao |
| 2012/0110536 | A1 * | 5/2012 | Agarwal ............... G06F 30/394 716/129 |

(Continued)

OTHER PUBLICATIONS

Notice of Allowance for U.S. Appl. No. 17/364,388 dated May 17, 2023.

(Continued)

*Primary Examiner* — Nha T Nguyen

(74) *Attorney, Agent, or Firm* — Vista IP Law Group, LLP

(57) ABSTRACT

Disclosed is an improved approach to implement concurrent processing of 3D-IC electronic designs using a die interface model. Instead of a die-by-die approach that implements each die separately, the concurrent multi-die approach permits the multiple dies to be physically implemented simultaneously, without prior budgeting and margins.

20 Claims, 9 Drawing Sheets

(56) References Cited

U.S. PATENT DOCUMENTS

| | | | |
|---|---|---|---|
| 2012/0254818 A1 | 10/2012 | Liu et al. | |
| 2015/0135147 A1* | 5/2015 | Emirian | G06F 30/347 |
| | | | 716/105 |
| 2015/0145143 A1* | 5/2015 | Samadi | G06F 30/392 |
| | | | 257/774 |
| 2015/0316605 A1 | 11/2015 | Deutsch et al. | |
| 2016/0042110 A1* | 2/2016 | Lim | G06F 30/392 |
| | | | 716/124 |
| 2020/0257841 A1* | 8/2020 | Sinha | G06F 30/394 |
| 2022/0068888 A1* | 3/2022 | Huang | H01L 25/50 |
| 2022/0164513 A1* | 5/2022 | Chao | G06F 30/3953 |

OTHER PUBLICATIONS

Non-Final Office Action for U.S. Appl. No. 17/219,695 dated Jan. 21, 2022.
Taouil, M., et al., "Exploring Test Opportunities for Memory and Interconnects in 3D ICS," Delft University of Technology, dated 2013.
Von Trapp, F., "Hybrid Bonding: From Concept to Commercialization," InCities, dated Apr. 2, 2018.
Kaibartta, T., et al., "Co-Optimization of TestWrapper Length and TSV for TSV Based 3D SOCs," Journal of Electronic Testing, dated 2020, 36:239-253.
Zhang, H., et al., "Three Dimensional Integrated Circuits," ScienceDirect, dated 2020.
Notice of Allowance for U.S. Appl. No. 17/219,695 dated Apr. 28, 2022.
Non-Final Office Action for U.S. Appl. No. 17/364,388 dated Jun. 27, 2022.
Non-Final Office Action for U.S. Appl. No. 16/789,296 dated Jul. 12, 2021.
Final Office Action for U.S. Appl. No. 16/789,296 dated Mar. 12, 2021.
Non-Final Office Action for U.S. Appl. No. 16/789,296 dated Nov. 18, 2020.
Notice of Allowance for U.S. Appl. No. 16/789,296 dated Nov. 8, 2021.
Final Office Action for U.S. Appl. No. 17/364,388 dated Jan. 9, 2023.
Billoint et al., "Merging PD Ks to Build a Design Environment for 3D Circuits: Methodology, Challenges and Limitations," 2019 International 3D Systems Integration Conference (3DIC), 2019, pp. 1-5, doi: 10.1109/3DIC48104.2019.9058793. (Year: 2019).

* cited by examiner

Load of driver = Load$_{n1}$ + Load$_{n2}$ + Load$_{n3}$ + PinLoad = Load$_{n1}$ + Load$_{n3}$ + PinLoad

METHOD OF DIE INTERFACE MODELING FOR CONCURRENT MULTI-DIE IMPLEMENTATION OF THREE-DIMENSIONAL INTEGRATED CIRCUIT (3D-IC)

CROSS-REFERENCE TO RELATED APPLICATIONS

The present application claims the benefit of priority to U.S. Provisional Application No. 63/369,657, filed on Jul. 27, 2022, which is hereby incorporated by reference in its entirety.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

Chip designers often use electronic design automation (EDA) software tools to assist in the design process. Chip design using EDA software tools generally involves an iterative process whereby the chip design is gradually perfected. A top-down design methodology is commonly employed using hardware description languages (HDLs), such as Verilog or VHDL for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high-level description, the actual logic cell implementation is typically determined by logic synthesis, which converts the functional description of the circuit into a specific circuit implementation. The logic cells are then "placed" (e.g., given specific coordinate locations in the circuit layout) and "routed" (e.g., wired or connected together according to the designer's circuit definitions). The placement and routing software routines generally accept as their input a flattened netlist that has been generated by the logic synthesis process. Various optimizations may then occur to revise the design to improve aspects such as timing performance of the integrated circuit.

Traditionally, the above-described process is performed individually for a single die in a two-dimensional integrated circuit (2D-IC). However, more recent electronic designs now include three-dimensional integrated circuit designs that include multiple dies in a stacked arrangement.

A three-dimensional integrated circuit (3D-IC) refers to integrated circuit device manufactured by stacking multiple dies and connected vertically by through-silicon vias (TSVs), bumps, or hybrid-bonding, so that it can achieve higher performance, reduced power and smaller footprint as compared to the conventional two-dimensional integrated circuit.

The physical implementation of the multiple dies in the 3D-IC design is typically performed using a "die-by-die" approach. In the die-by-die approach, each of the dies in the 3D-IC design are implemented separately from each other. This approach usually starts with the implementation of a first selected die (e.g., where the die is selected because it is most critical die or simply because it is the bottom-most die), and after the first die has its physical implementation completed, the design information for that first die (e.g., bump locations) is passed to implement the design of a neighboring die, where succeeding iterations of these procedures are performed in a sequence of such activities to separately implement another die until all of the dies have been completed.

After each of the dies have been separately processed for their physical implementations in the die-by-die approach, the electronic designer/engineer will then need to take additional steps to perform design, planning, and budgeting at the system level. Multiple design iterations are often needed for design metrics of the system to converge and meet intended or acceptable specification levels.

However, for high performance 3D-ICs whose two neighboring dies have large number of cross-die timing paths, the die-by-die approach is far from sufficient to optimize the overall design to achieve better performance, power and area (PPA) goals. This is because the die-by-die approach operates with an almost built-in assumption of the separation of multiple die devices, whereas the 3D-IC design is really just a single device from a system point of view. This can lead to inefficiencies for the overall design process in the die-by-die approach. For example, when the cross-die timing path is cut into two separate dies, it often becomes very difficult to effectively and accurately achieve accuracy with timing budgeting, e.g., with respect to analysis and prediction of path delays and loads across such cross-die boundaries when they have been separated. By way of example, Memory-on-Logic designs implemented as a 3D-IC is one of the challenging applications that is difficult to be implemented with the die-by-die flow. Memory-on-Logic 3D-IC is a type of design having logic cells (registers and combinational logics) and memory hard macros that is characterized by having the memories on one die and the logic cells on the other die. The two dies are stacked as a 3D-IC device, e.g., with hybrid-bonding or equivalent technology connecting them. The implementation challenges not only include the timing budgeting and modeling problem, but also includes the placement of the memory macros, because the placement of the memories need to be optimized according to the placement of the logic cells. In die-by-die flow, each die is implemented separately so they cannot account for each other to efficiently achieve an overall optimal result.

It is therefore desirable to use a more integrated approach to implement the physical design of a 3D-IC product and to avoid the die-by-die approach. The problem is that existing EDA tools are almost universally predicated upon the assumption of a 2D design. Since existing EDA tools operate on a 2D model, the die-by-die approach is conventionally seen as a suitable way to implement the 3D-IC design since each die is in effect a separate 2D design. As a result, it becomes very difficult to provide a more-integrated design approach for the multiple dies of a 3D-IC design with existing 2D-oriented tools.

Therefore, what is needed is an improved approach to implement electronic designs corresponding to 3D-IC designs, particularly for 3D-IC designs that are implemented as memory-on-logic designs.

SUMMARY

Embodiments of the invention provide an improved method, system, and computer program product to implement concurrent processing of 3D-IC electronic designs using a die interface model. Instead of a die-by-die approach that implements each die separately, the concurrent multi-die approach permits the multiple dies to be physically implemented simultaneously, without prior budgeting and margins. This concurrent multi-die approach can therefore implement the stacked dies in one pass and give better performance, power, and area (PPA) with less turn-around-time.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
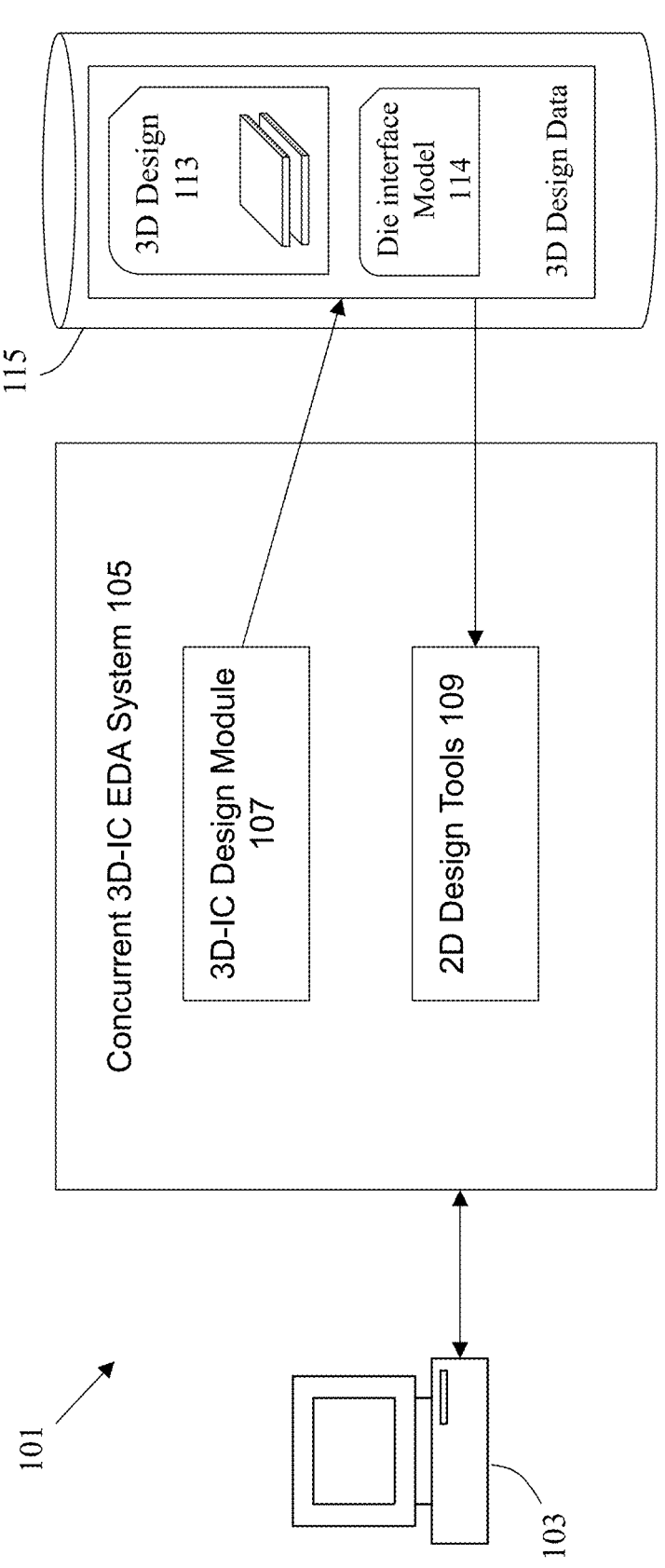
FIG. 1 shows a high level architecture of a system, according to some embodiments, having a concurrent 3D-IC EDA system for implementing the multiple dies of the 3D-IC design.

FIG. 1 shows a high level architecture of a system 101, according to some embodiments, having a concurrent 3D-IC EDA system 105 for implementing the multiple dies of the 3D-IC design 113 using a concurrent multi-die flow. Instead of a die-by-die approach that implements each die separately, the concurrent multi-die approach permits the multiple dies to be physically implemented simultaneously, without prior budgeting and margins. This concurrent multi-die approach can therefore implement the stacked dies in one pass and give better performance, power, and area (PPA) with less turn-around-time.

System 101 may include one or more users that interface with and/or operate a computing system to control and/or interact with system 101 using a computing station 103. Such users include, for example, design engineers or verification engineers. The computing system comprises any type of computing station 103 that may be used to operate, interface with, or implement the concurrent 3D-IC EDA system/application 105. Examples of such computing systems include for example, servers, workstations, personal computers, or remote computing terminals connected to a networked or cloud-based computing platform. The computing system may comprise one or more input devices for the user to provide operational control over the activities of the system 101, such as a mouse or keyboard to manipulate a pointing object. The data generated by EDA system 101, including for example 3D-IC design data 113, may be stored in a computer readable storage medium 115. The computer readable storage medium 115 includes any combination of hardware and/or software that allows for ready access to the data that is located at the computer readable storage medium 115. For example, computer readable storage medium 115 could be implemented as computer memory and/or hard drive storage operatively managed by an operating system, and/or remote storage in a networked storage device, such as networked attached storage (NAS), storage area network (SAN), or cloud storage. The computer readable storage medium 115 could also be implemented as an electronic database system having storage on persistent and/or non-persistent storage.

The concurrent 3D-IC EDA system/application 105 is employed to operate upon design data to generate a 3D-IC design 113. To accomplish this, the concurrent 3D-IC EDA system/application 105 may include multiple processing modules, such as a 3D-IC design module 107 to implement the 3D-IC design 113.

The inventive concepts may implement concurrent processing of dies for a 3D-IC design even when using EDA design tools 109 that are designed to operate upon 2D designs. As previously discussed, a problem with existing EDA tools with regards to processing of 3D-IC designs is that are almost universally predicated upon the assumption of a 2D design, which resulted in the conventional approach to process such 3D designs with the die-by-die approach.

However, the current invention is able to provide a more integrated concurrent approach to process 3D designs, even when using 2D-based EDA design tools 109, by implementing die interface models 114. This approach uses a virtual die interface module between the stacked dies, implementing a logical connectivity that can thus permit modelling and analysis of the integrated stack of multiple dies.

Figure 2:
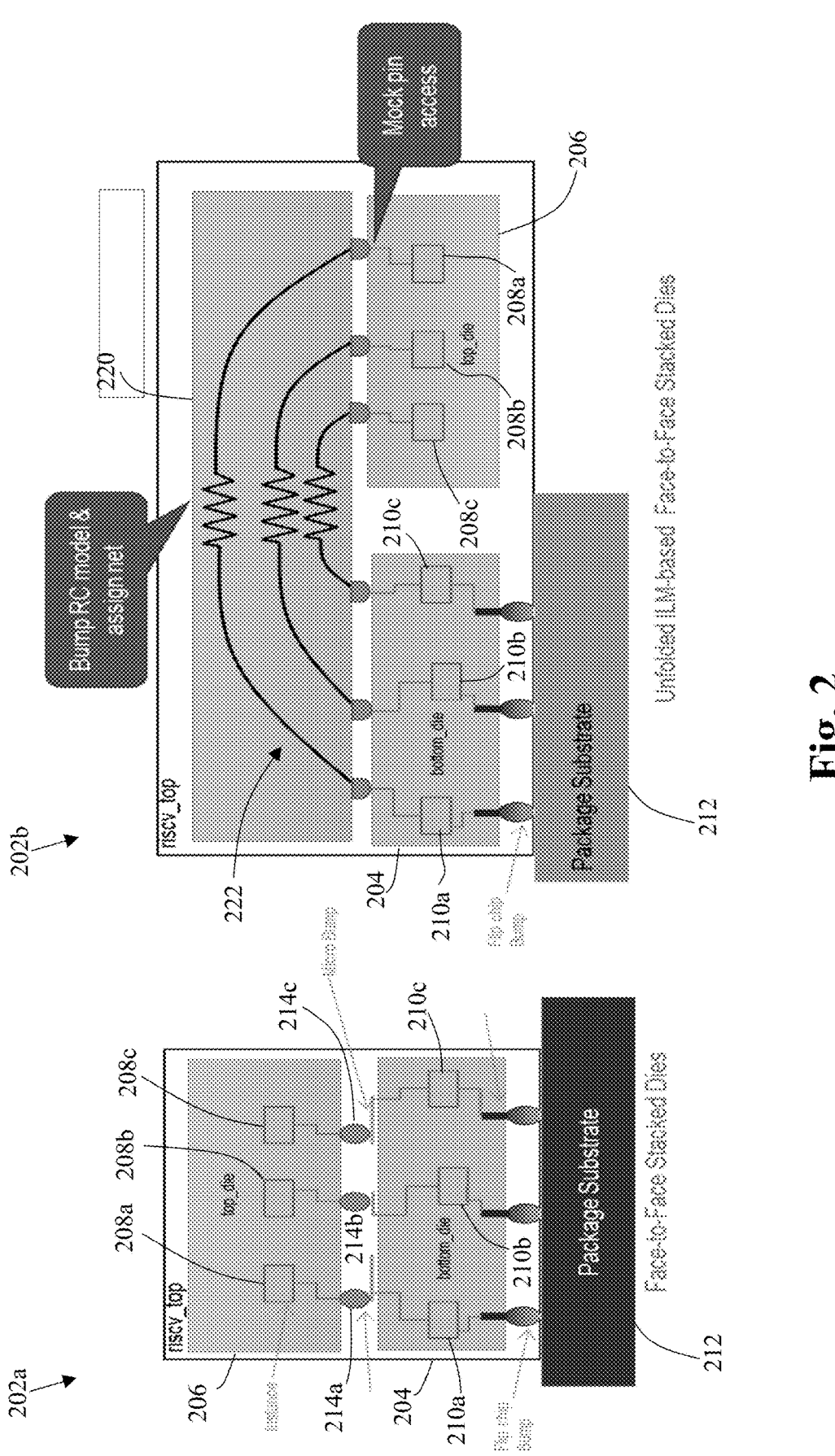
FIG. 2 provides an example illustration of a 3D-IC design.

To explain, consider the example illustration of a 3D-IC design 202*a* shown in FIG. 2. This 3D-IC design 202 includes two dies (bottom die 204 and top die 206) in a stacked arrangement of face-to-face dies. The stacked die arrangement is disposed on a package substrate 212. The bottom die 204 includes connection/pin locations 210*a*, 210*b*, and 210*c*. These connection/pin locations 210*a*, 210*b*, and 210*c* on the bottom die 204 are intended to connect to corresponding connection/pin locations 208*a*, 208*b*, and 208*c*, respectively, on the top die 206. Micro-bumps 214*a*, 214*b*, and 214*c* are inserted to connect the bottom die 204 to the top die 206.

With the current embodiments of the invention, design activities are performed for this stacked-die arrangement concurrently for both the bottom die 204 and the top die 206. This approach begins by unfolding the stacked set of dies in the 3D-IC design.

Unfolding is performed to unfold the vertical stacking of the multiple dies in stacked arrangement 202*a* to generate the unfolded arrangement 202*b*. By unfolding the vertical stacking of the multiple dies, the 3D-IC design is physically partitioned into each die's floorplan according to the die orientation and placement location, and logically partitioned to each die's hierarchical module with feedthrough insertion. In effect, the unfolded arrangement 202*b* opens the top die 206 sideways to a new orientation while retaining the same physical configuration of the die in its new sideways orientation. As a result, the same connections/pins 208*a*, 208*b*, and 208*c* will still exist in die 206, but due to the unfolding action, will be mirrored and flipped to face upwards in the unfolded arrangement 202*b*.

In its unfolded state 202*b*, the 3D-IC design now has its multiple dies effectively in the same, common 2D arrangement. As such, this means that both dies can now be concurrently processed using a 2D-based EDA tool for any subsequent design activity, such as place and route activities or timing analysis activities.

Now that the stacked arrangement has been unfolded, the question to be faced is how to correctly model the 3D impact of the unfolded arrangement and interconnection between the unfolded dies. It is very important for this to be modelled correctly, particularly with respect to the bumps 214*a*, 214*b*, and 214*c*. With the folded arrangement, the connection/ bump locations were at exact adjacent locations in-between the two dies. However, with the unfolded arrangement, the intended interconnection/bump locations are no longer directly adjacent to each other between the two dies, but rather a much larger distance has opened up between the interconnection points. Firstly, the pin access details should be maintained correctly, particularly with respect to the physical locations for the pins on the dies. Secondly, the electrical characteristics should be implemented such that any downstream analysis will generate correct analysis results with respect to the bump-related analysis and modelling. By satisfying these conditions, a conventional 2D EDA tool can now operate against the 3D design in a concurrent manner, even without re-writing the underlying code within the 2D-based EDA tool.

The disclosed approach can be used in concurrent multi-die implementation to model the connectivity, the physical shape, the location, and the resistance/capacitance (RC) parasitic of the die-to-die contact (e.g. bump, wafer-bonding, etc.). To accomplish this, a virtual die interface module 220 can be created between each of the two contact dies. The logical connectivity of the module 220 serves as a transparent feedthrough between the two dies. The pin physical location(s) can be derived from any form of bump assignment tool or algorithm, and it can be used to model the die-to-die contact (bump, wafer-bond, TSV, etc.) shape and location. This information is useful, for example, to implement place and route activities during physical implementation.

The RC parasitic of the die-to-die contact is modeled by the RC value on the feedthrough net 222, so that the timer and optimization engine can see the loading of the cross-die net accurately to calculate the transition and delay. For example, in real practice, the virtual die interface model can be achieved by Interface Logic Model (ILM) which is widely used in 2D hierarchical implementation flow. With such die interface modeling, the existing physical design engines and features which can support 2D hierarchical implementation flow, including place, optimization, clock tree synthesis, route, ECO, etc., are enabled to work on 3D-IC concurrent multi-die implementation immediately.

This approach can be applied to both homogeneous and heterogeneous 3D stacking. In addition, this approach can be applied to any orientation of stacked dies, including for example, both face-to-face and face-to-back 3D stacking. Both stacked and unfolded floorplan of the 3D-IC maybe processed using the described techniques. In addition, any number of dies may be processed using the current approach, including any of 2 or more dies. This approach can be applied to both stacked dies (3D) and side-by-side dies (2.5D). Moreover, this approach is customizable for bump/wafer-bond/TSV RC modeling, and is compatible with any distributed RC model.

Figure 3:
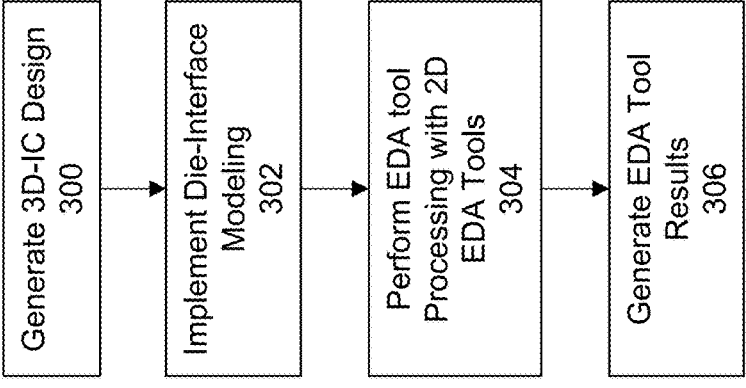
FIG. 3 shows a high level flowchart of an approach to implement some embodiments of the invention.

FIG. 3 shows a high level flowchart of an approach to implement some embodiments of the invention. At 300, a 3D-IC design is implemented. Any type of logic/design may be implemented using a 3D-IC arrangement. For instance, consider a 3D-IC design that includes both macros and standard cells that are concurrently placed using embodiments of the invention. A floorplan may be generated that includes macros on the floorplan of a first die and standard cells on the floorplan of a second die in a vertically stacked arrangement. The approach of having macros on one die and standard cells on another die is a common design situation.

At 302, die interface modeling is implemented for the 3D-IC design. According to some embodiments, a virtual die interface module is created between each two contact dies, where the logical connectivity of the module serves as a transparent feedthrough between the two dies (e.g. Verilog assign net). The RC parasitic of the die-to-die contact is model by the RC value on the feedthrough net, so that the timer and optimization engine can see the loading of the cross-die net accurately to calculate the transition and delay.

Figure 4:
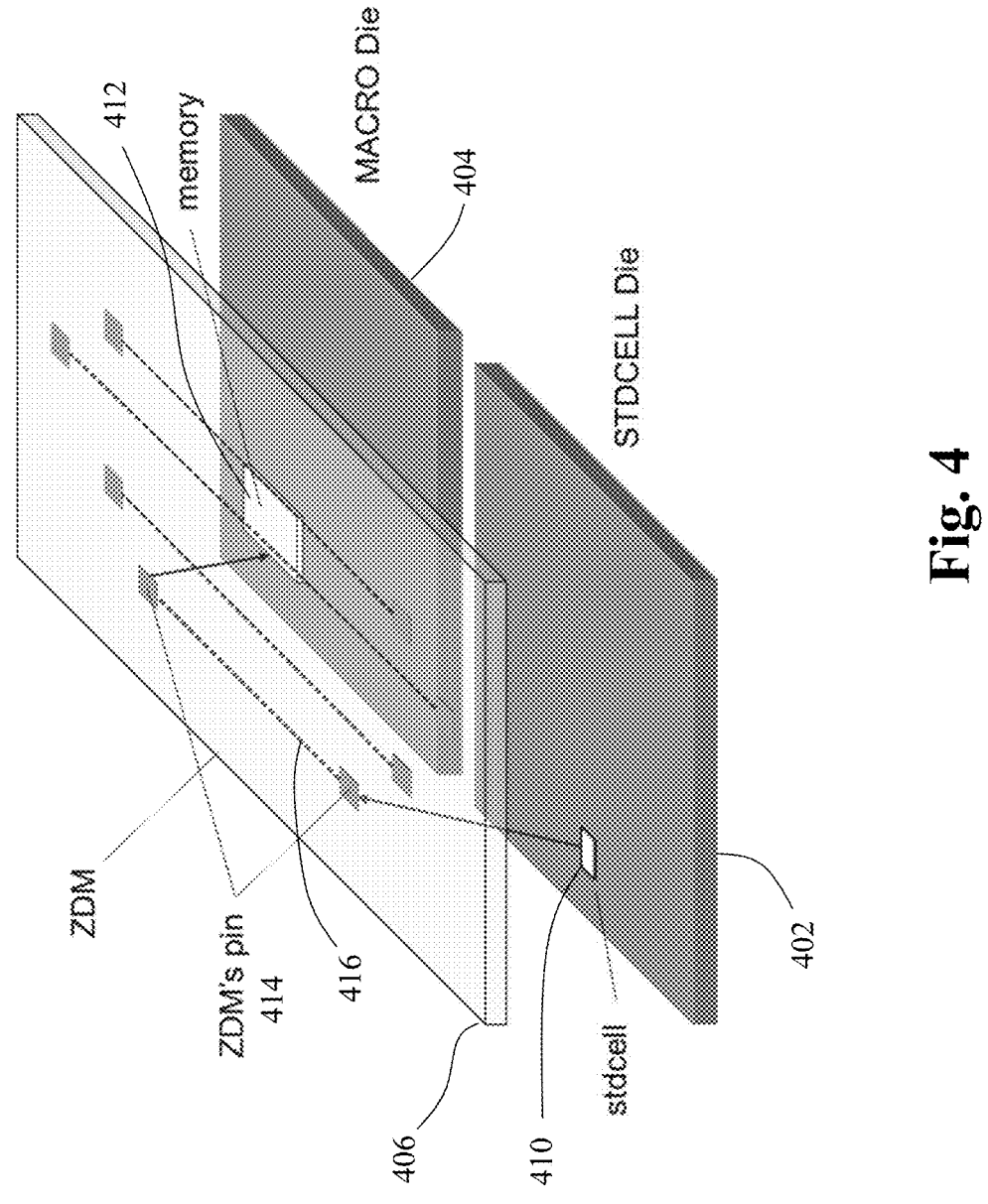
FIG. 4 illustrates a die interface model.

With reference to FIG. 4, this figure shows two dies 402 and 404. Die 402 corresponds to a standard cell die and die 404 corresponds to a macro die. A die interface module 406 is implemented that is referred to herein as a Zero Delay Module or ZDM for short. The ZDM can be achieved as an application of an Interface Logic Model (ILM).

The concept of an ILM is widely used in many EDA 2D hierarchical implementation flows. In the field of electronic design, ILM is a technique that is used to model blocks in hierarchical implementation flows. For instance, it can be used to model the gate level implementations of a physical block, where the entire path of for the block is visible at a top level for interface nets.

In the ZDM, the bump-to-bump RC (resistance-capacitance) information can be annotated in the ILM module. As such, the entire path from a pin 410 in die 402 to pin 412 in die 404 can be correctly analyzed, to account for the loading on that path. The bump parasitics between the ZDM pins 414 can be modelled and annotated for path segment 416 between the bump pins 414 to provide the RC characteristics of the bump. In particular, this figure shows the correct bump locations on the dies, with the bump location mirrored for the unfolded die 404 (in a face-to-face stacked die arrangement). Unlike an ILM model that includes real logic for a design (e.g., AND gates, OR gates, inverters, etc.), the ILM model for the ZDM only includes an I/O net from one point to another. This implements interface logic that corresponds to the RC characteristics to be annotated for the intended bump information of the ZDM. In effect, a subset of the extensive capabilities of an ILM model is used to implement the ILM model for the ZDM, where the subset if used as necessary to correctly model the RC characteristics of the I/O net from one pin to another.

It is noted that each pin pair of a die interface module models a die-to-die contact. The bump or wafer-bond of top and bottom die need to be aligned. However, the two pins on the die interface module does not necessarily have to be on the same location globally. They can be different location or different layer if the relative location and orientation to its die origin (local coordinate) can be aligned. Typically, using the unfolded floorplan approach, the two pins are mirrored to each other along the folding line. But the implementation of this approach can still bypass the distance between them and treat them as directly aligned. The time delay due to this distance is regarded as zero, so that multiple dies can still be implemented on an unfolded 2D floorplan.

Referring back to FIG. 3, the next step at 304 is to perform EDA tool processing upon the unfolded design having the die interface model. Since the unfolded design appears to a tool to be a 2D design, any 2D-based tool can now process this unfolded design. In addition, with the implementation of the die interface modeling of the present invention, existing physical design engines and features which can support 2D hierarchical implementation flow, including place and route, timing optimization, clock tree synthesis, route, ECO, etc., can now correctly work on 3D-IC concurrent multi-die implementations and effectively and efficiently be used to generate correct and accurate results at step 306.

The IC backend implementation flow therefore can be run concurrently on multiple dies without any form of budgeting or die modeling. The approach removes the need of die-by-die iteration and better improves the performance, power and area result of a 3D-IC design. This approach is therefore significantly better than alternative approaches that first partitions the design into multiple dies and then afterwards performs placement after the partitioning, since this alternative approach will not permit concurrent optimization due to the need to address each die on a die-by-die basis.

Figure 5:
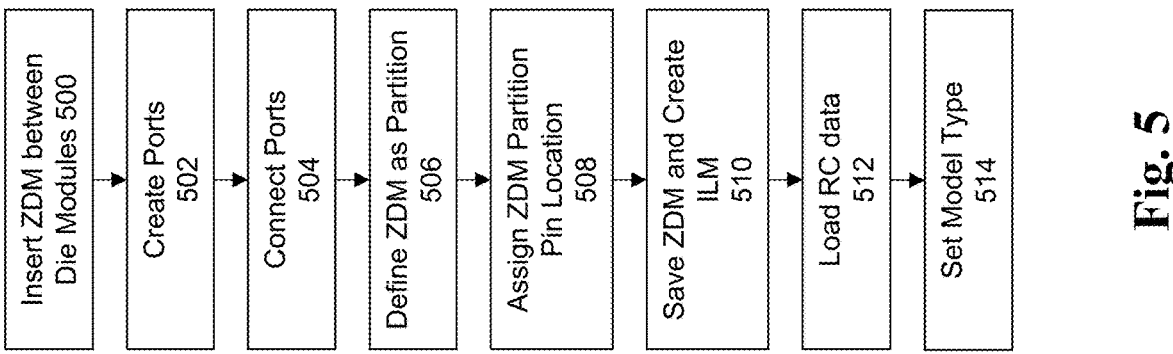
FIG. 5 shows a detailed flowchart of steps to implement a die interface model according to some embodiments of the invention.

FIG. 5 shows a detailed flowchart of steps to implement a die interface model according to some embodiments of the invention. The sequence of steps for this flow will be illustratively explained with respect to the structures shown in FIG. 6. It is noted that this example flow is directed to implementation of a ZDM for a two-die stack. For multiple dies, the steps described below for the model would be created for all the die interfaces of the multiple dies.

Figure 6:
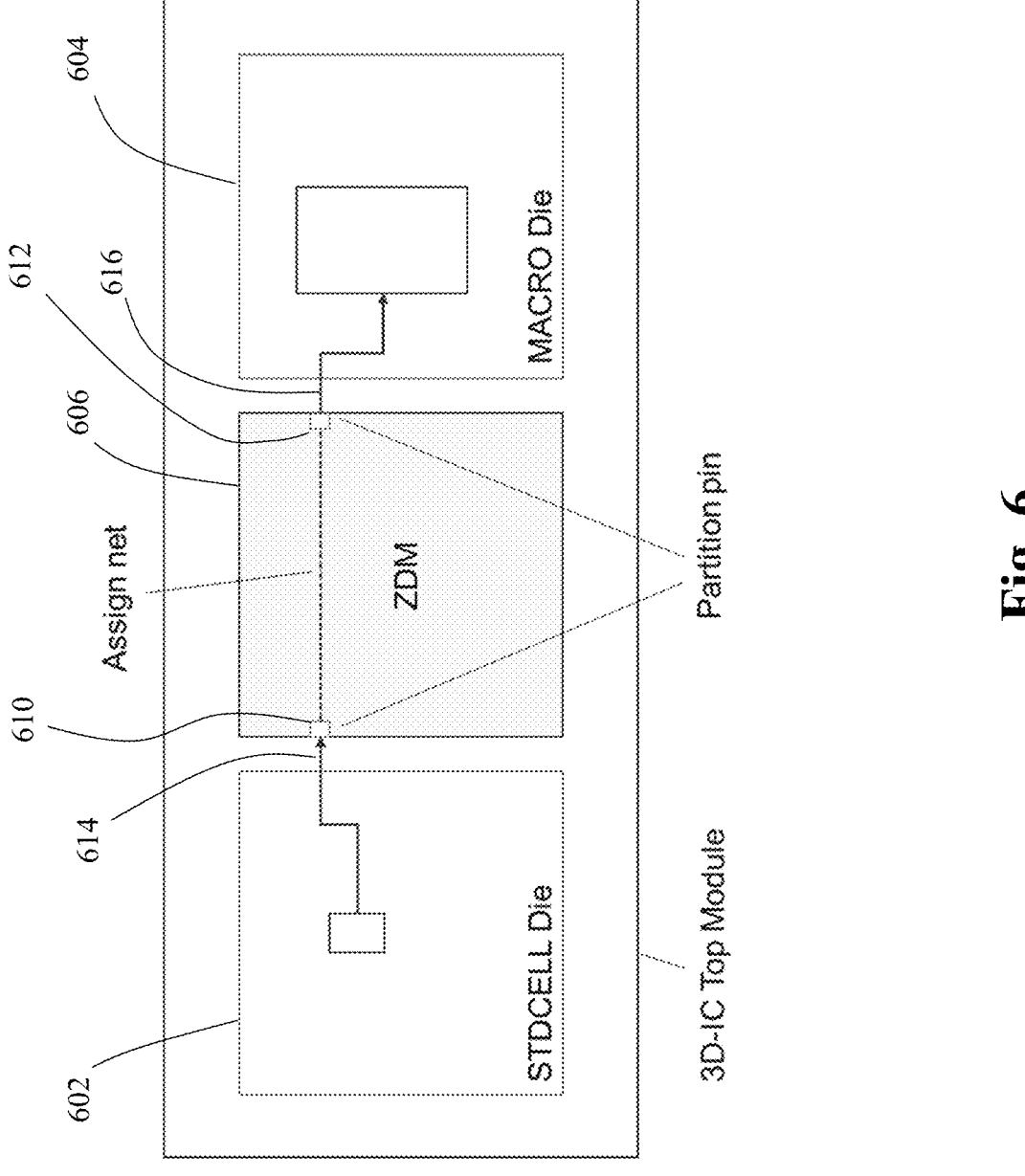
FIG. 6 provides an illustration for the actions of FIG. 5.

At step 500, in the netlist, a ZDM is inserted between a respective first and second module for a first die and a second die. FIG. 6, shows a first die module 602 and a second die module 604. With respect to the step to insert a ZDM, this figure shows a ZDM 606 that is inserted between die module 602 and die module 604.

At step 502, ports are created on the ZDM. In particular, for each cross-die net between the first die and the second die, create two ports on the ZDM boundary. As shown in FIG. 6, ports 610 and 612 are created on the boundaries of ZDM 606.

Next, at step 504, the ZDM ports are connected to the dies. This action will connect one of the two ports to the first die's module port of the cross-die net. This will also connect the other port to the second die's module port of the cross-die net. As shown in FIG. 6, the ports 610 and 612 will connect to the dies at 614 and 616, respectively. In some embodiments, this step will create an assign statement inside the ZDM to connect the two ports that were created.

A step 506, the ZDM is defined as a partition. At step 508, the ZDM's partition pin location is assigned according to bump assignment. The bump assignment can be user specified or comes from any bump assign algorithm. For example, it can use the shadow bump assignment output after 3D mixed placement.

At 510, the ZDM partition is saved, and an ILM is created for the ZDM partition. At 512, RC information is loaded for the ILM. In some embodiments, the RC parasitics of the bump/wafer-bond/TSV or die-to-die coupling capacitance which come from RC extraction tool are loaded to the assign nets in the ILM. These can be saved in the SPEF file of the ILM. Finally, at 514, in the top-level view database (DB), this step will set the ZDM's model type to its ILM.

Figure 7:
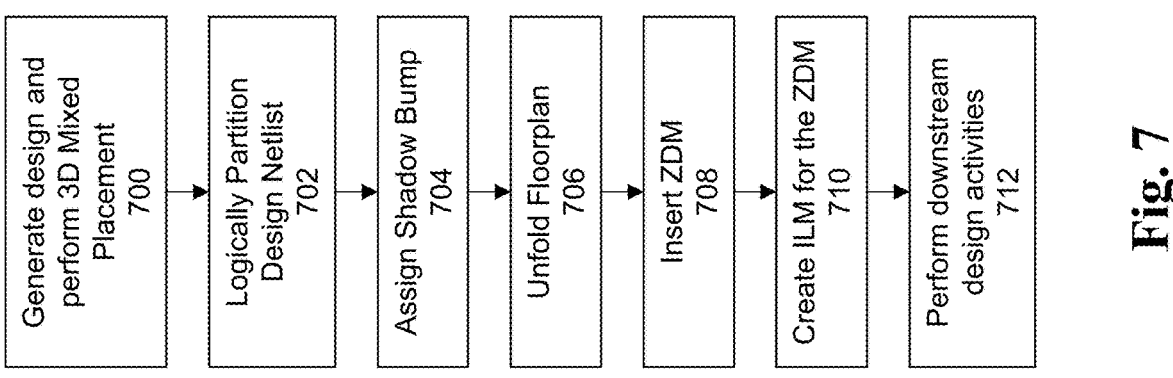
FIG. 7 shows a flowchart of an approach to use the ZDM interface model in a full flow of a concurrent multi-die implementation.

FIG. 7 shows a flowchart of an approach to use the ZDM interface model in a full flow of a concurrent multi-die implementation.

At 700, the 3D-IC design is generated and 3D mixed placement is performed upon the design. Any suitable approach or tool may be employed to generate the electronic design. For example, in some embodiments, a designer may produce a specification of the desired behavior of the circuit design, e.g., using a standard format such as RTL (register transfer level). A synthesis tool may then convert the RTL representation into its representation having design components, e.g., into a design language such as VHDL or Verilog.

A floorplan can be created for the electronic design. To accomplish this, the process starts with the initial netlist, where the size of the floorplan is configured such that in a vertically stacked arrangement of multiple dies (e.g., two stacked dies), the size of the floorplan selected for each die is approximately half of the size of a comparable floorplan if implemented as a 2D design. It is noted that the dies may also corresponds to different die sizes.

A 3D mixed placement is performed for the 3D-IC, where this action places the design on the floorplan with 3D concurrent macro and standard cell placement (3D mixed placement). In some embodiments, the 3D mixed placer can be implemented as an enhancement to a suitable existing 2D mixed placer by allowing the macro and standard cells be placed on two different planes while still optimizing PPA metrics.

It is noted that the density and area of the macros may not exactly match the area/density of the standard cells. As such, it is possible for example, that the macros encompass a greater amount of area as compared to the standard cells, e.g., where the macros encompass 55% of the overall area and the standard cells encompass 45% of the area. Therefore, it is possible that the size allocated to the floorplan for the top die is not enough to hold the required area of the macros, while too much size is allocated for the bottom die that holds the standard cells (or vice versa). There are multiple approaches that can be taken to address this issue if necessary. One possible approach is to increase the size of the floorplan of the die(s) to accommodate the shortfall.

Another possible approach in some embodiments is by using the placement process to place some of the macros from the top die onto the bottom die.

The 3D mixed placer may concurrently place both the macros and standard cells. In addition, in the current embodiment the 3D mixed placer will optimize the instance locations by PPA factors as well. For example, the 3D mixed placer will optimize the instance location according to variables such as timing, density, wire length, and floorplan constraints. Additional actions taken by the 3D mixed placer may include, for example, placement considerations for: (a) TSVs; (b) power/ground structures; (c) ESD cells; (d) testing structures; and/or (e) cells pertaining to 3D manufacturing.

At 702, logical partitioning is performed on the design netlist. This action logically partitions the design netlist based upon the die contents. In effect, the design is partitioned into two separate dies for subsequent actions, if necessary. This action breaks up the logical design representation into two separate dies.

At 704, "shadow" bumps are assigned in the design. This action includes the assignment of the connecting structures (e.g., bumps) that implement cross-die connections, which in some embodiments are embodied as bumps. It is noted that other connecting technologies may also be used, such as hybrid bonding, and thus this step is also applicable to these other connecting technologies as well. The term "shadow" may be applied to these bumps since they will be represented initially only as locations for the bumps, but will be replaced as real bumps later in the design process.

This action to assign shadow bumps is taken by identifying all bump locations on the floorplan. In some embodiments, the assignment of the shadow bumps is performed by identifying and assigning based upon a shortest location to the pertinent structures to minimize wire lengths, e.g., with shadow bump locations very close to a macro pin.

It is noted that the bumps may be assigned according to any suitable ordering or prioritization. For example, in some embodiments, some or all of the power and ground bumps may be assigned/reserved first. This can be followed by assignment of bumps for clock nets with the shortest distances. Afterwards, the signal nets can then be assigned.

At 706, the floorplan is unfolded. The unfolding step unfolds the vertical stacking of the multiple dies from the results of the 3D mixed placement process. By unfolding the vertical stacking of the multiple dies, the 3D-IC design is physically configured into a 2D representation having each die's floorplan according to the die orientation and placement location, and logically partitioned to each die's hierarchical module with feedthrough insertion.

The design may be physically unfolded, where this action takes the stacked floorplan, and resizes the floorplan into an unfolded, resized floorplan. The resized floorplan is resized by twice the area vertically (e.g., if the top and bottom dies are the same size). In effect, the unfolding will occur by unfolding the top die from overlapping the bottom die to the upper half of the new floorplan. It is noted that with face-to-face designs, the dies will also be mirrored. For example, the mirroring may occur along the X-axis. Therefore, the tool will mirror the location and flip MX each individual instance and ZDC (zero delay cells) accordingly because the top die is facing down. For face-to-back designs, no mirroring may need to occur (although other actions such as insertion of TSVs may need to occur).

At 708, the ZDM is inserted, and at 710 an ILM is created for the ZDM. The ZDM is inserted between two dies within the design. The actions described with respect to FIG. 5 may be performed in some embodiments to insert the ZDM and to create the ILM.

At 712, downstream design activities are performed on the unfolded design having the die interface model. A non-limiting set of example activities may include timing closure, optimization, power implementations, placement, and routing. Any suitable set of activities may occur in this step. For example, power planning is performed for the design. In addition, clock tree synthesis (CTS) and optimization (e.g., pre-CTS and post-CTS optimizations) may be performed. Both routing and post-route optimizations may be performed for this step. In addition, timing analysis and timing optimizations may also occur.

This approach permits optimization to occur very efficiently and effectively, without requiring separate modeling (as would be required in a die-by-die approach where a model exists for each die), and produce more accurate and effective results since both dies are concurrently optimized and designed on the same 2D unfolded representation—rather than optimizing each die separately without the need for budgeting, user interactive or scripting iteration between dies as would occur in a die-by-die approach.

It is noted that other EDA tools and modules may also be employed within the scope of the invention, such as a DRC (design rule check) checking tool, timing analysis tool, power planning tools, routing tools, clock management tools, etc. For example, a DRC checking tool can be employed to check for any rules violations that may exist for any of the placement and/or routing configurations generated by a place and route. Design rules are a series of parameters provided by semiconductor manufacturers, specifying geometric and connectivity restrictions to ensure sufficient margins to account for variability in semiconductor manufacturing processes. The DRC checking tool is applied to verify the correctness of any designs, and to identify possible issues that may affect overall yield or reliability for the design. A timing analysis tool may also be provided to analyze the expected timing performance of the electronic design. It is noted that any suitable or useful tool and/or modules may be employed to perform other aspects of EDA processing for the electronic design and as such should be deemed to be included within the scope of EDA system 105. A routing tool can be employed to implement routing structures and/or other wiring structures for the electronic design. The above tools may be utilized on an unfolded design to optimize timing, density, power, wire length, and/or based upon any applicable floorplan constraints.

By way of example, some embodiments may perform the action of implementing pseudo-3D timing closure with the ZDM. When using the invention, analysis may be performed to analyze and report on timing that considers all of the loading on a given net from a first die to a second die.

Figure 8:
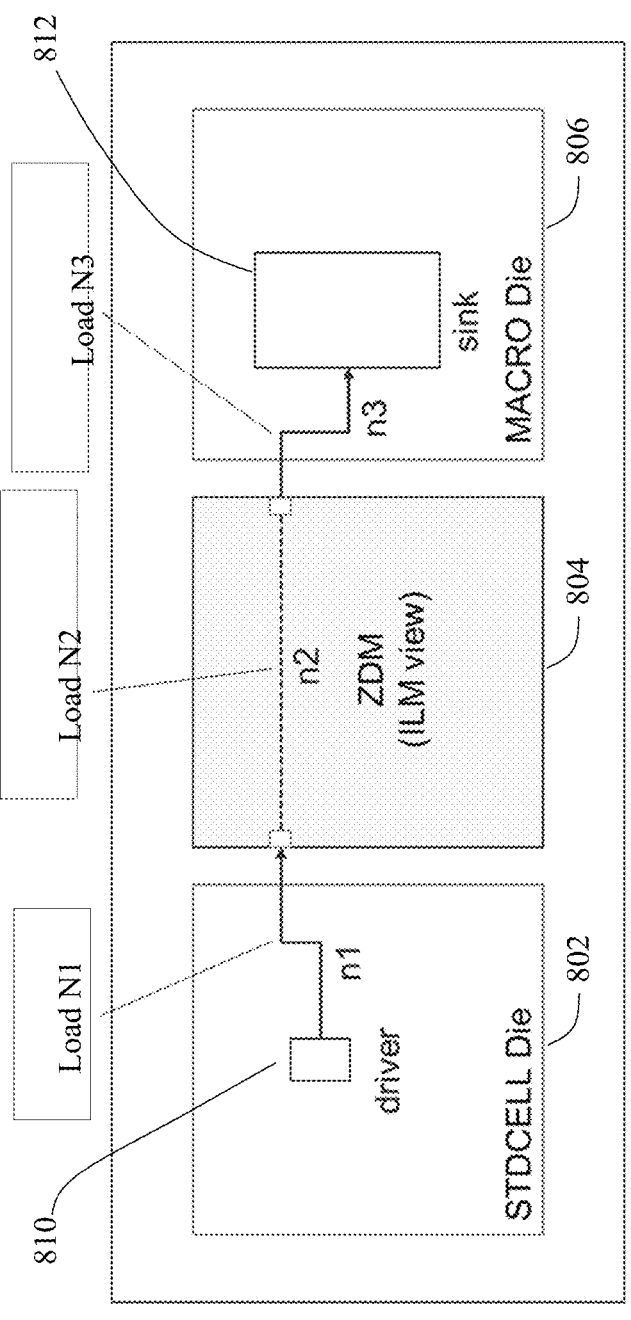
FIG. 8 provides an illustration of for this type of timing analysis ZDM.

FIG. 8 provides an illustration of for this type of timing analysis with a ZDM. Here, a ZDM 804 has been created between the standard cell die 802 and the macro die 806. The ZDM 804 represents the RC load relative to the bump that would be inserted between the standard cell die 802 and the macro die 806. In this situation, a timing analysis engine could perform timing analysis and closure by stitching together all of the loads between the driver 810 and the sink 812. The load of the driver 810 can be calculated by considering Load N1 (inside the die 802 from driver 810), Load N2 (ZDM load), Load N3 (load inside the die 806 to the sink 812) and the Pin load of the sink 812. In this situation, if the ZDM load N2 is at zero RC, the load of the driver is Load N1 plus load N2 plus the pin load.

Therefore, what has been described is an improved approach for implementing a three-dimensional integrated circuit design using concurrent processing with die interface modeling. Instead of a die-by-die approach that implements each die separately, the concurrent multi-die approach permits the multiple dies to be physically implemented simultaneously, without prior budgeting and margins. This concurrent multi-die approach can therefore implement the stacked dies in one pass and give better performance, power and area (PPA) with less turn-around-time.

This approach can be applied to both homogeneous and heterogeneous 3D stacking. In addition, this approach can be applied to any orientation of stacked dies, including for example, both face-to-face and face-to-back 3D stacking. Both stacked and unfolded floorplan of the 3D-IC maybe processed using the described techniques. In addition, any number of dies may be processed using the current approach, including any of 2 or more dies. This approach can be applied to both stacked dies (3D) and side-by-side dies (2.5D). Moreover, this approach is customizable for bump/wafer-bond/TSV RC modeling, and is compatible with any distributed RC model.

System Architecture Overview

Figure 9:
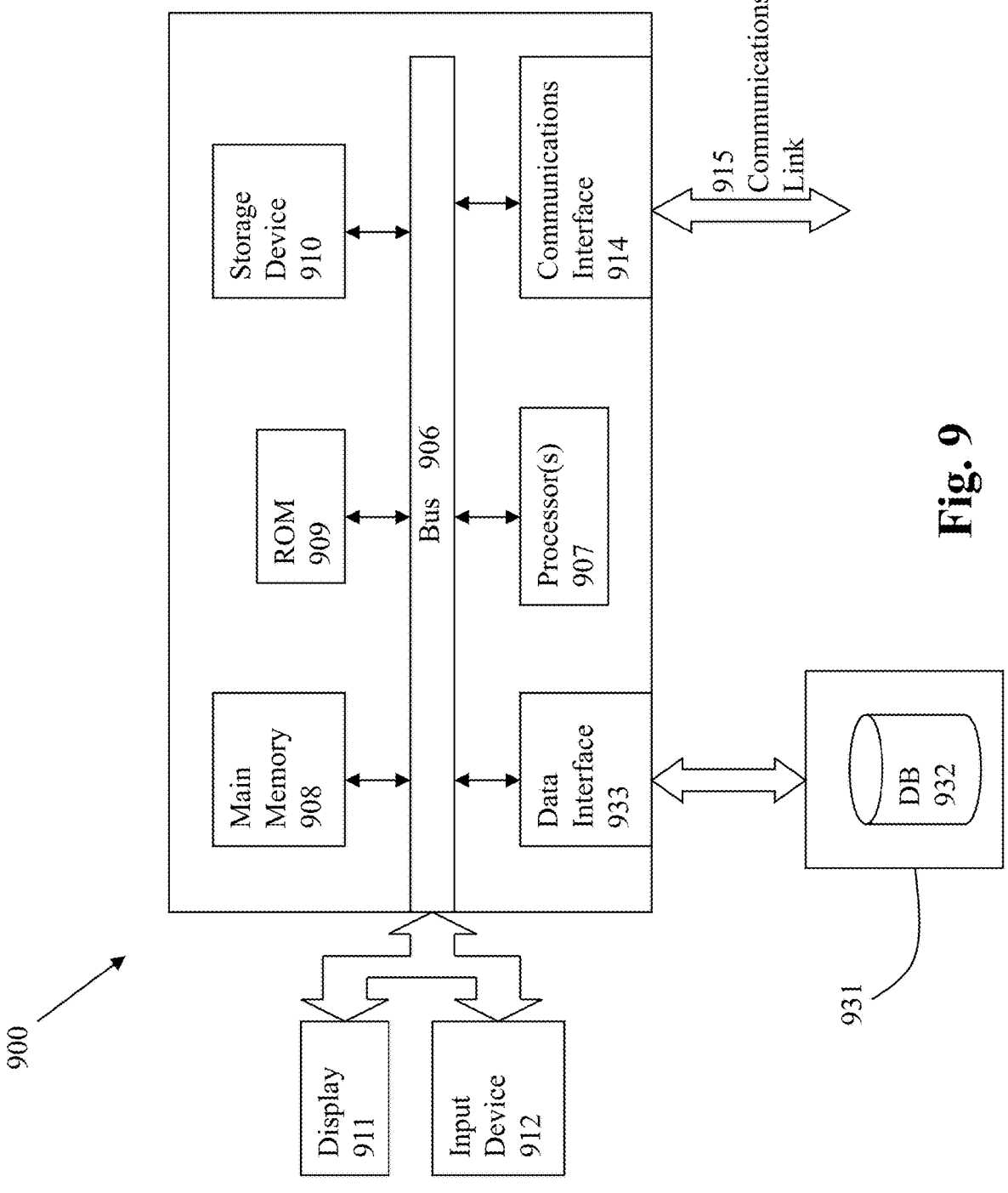
FIG. 9 is a block diagram of an illustrative computing system suitable for implementing an embodiment of the present invention.

FIG. 9 is a block diagram of an illustrative computing system 900 suitable for implementing an embodiment of the present invention. Computer system 900 includes a bus 906 or other communication mechanism for communicating information, which interconnects subsystems and devices, such as processor 907, system memory 908 (e.g., RAM), static storage device 909 (e.g., ROM), disk drive 910 (e.g., magnetic or optical), communication interface 914 (e.g., modem or Ethernet card), display 911 (e.g., CRT or LCD), input device 912 (e.g., keyboard), and cursor control.

According to one embodiment of the invention, computer system 900 performs specific operations by processor 907 executing one or more sequences of one or more instructions contained in system memory 908. Such instructions may be read into system memory 908 from another non-transitory computer readable/usable medium, such as static storage device 909 or disk drive 910. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 907 for execution. Such a medium may take many forms, including but not limited to, non-volatile media and volatile media. Non-volatile media includes, for example, optical or magnetic disks, such as disk drive 910. Volatile media includes dynamic memory, such as system memory 908.

Common forms of non-transitory computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and any other non-transitory medium from which a computer can read.

In an embodiment of the invention, execution of the sequences of instructions to practice the invention is performed by a single computer system 900. According to other embodiments of the invention, two or more computer systems 900 coupled by communication link 915 (e.g., LAN, PTSN, or wireless network) may perform the sequence of instructions required to practice the invention in coordination with one another.

Computer system 900 may transmit and receive messages, data, and instructions, including program, e.g., application code, through communication link 915 and communication interface 914. Received program code may be executed by processor 907 as it is received, and/or stored in disk drive 910, or other non-volatile storage for later execution. Computer system 900 may communicate through a data interface 933 to a database 932 on an external storage device 931.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method, comprising:

generating an electronic design for a three-dimensional integrated circuit (3D-IC);

unfolding a three-dimensional (3D) placed design to create an unfolded design having a two-dimensional (2D) representation, wherein the unfolded design comprises a die interface model between a first die and a second die, the die interface model comprises a zero delay module implemented using an interface logic model (ILM), and the die interface model corresponds to an interface component to be manufactured to connect the first die and the second die; and performing concurrent analysis on the 2D representation of the 3D-IC using an electronic design automation (EDA) tool, wherein the concurrent analysis analyzes the first die in conjunction with analysis of the second die.

2. The method of claim 1, wherein the ILM comprises an input/output (I/O) net without logic components for each pin pair between the first die and the second die.

3. The method of claim 1, wherein the concurrent analysis comprises at least one of timing analysis, power planning, clock tree synthesis, optimization, placement, or routing.

4. The method of claim 3, wherein the timing analysis is performed by stitching together loads between the first die and the second die comprising a first load from the first die, a second load from the second die, and a third load from the die interface model.

5. The method of claim 1, wherein the die interface model comprises an annotation for resistance/capacitance (RC) characteristics of a feedthrough net between the first die and the second die.

6. The method of claim 1, wherein the die interface model corresponds to a bump, a micro-bump, a hybrid-bond, or a through-silicon via (TSV).

7. The method of claim 1, wherein the concurrent analysis on the 2D representation of the 3D-IC is performed using a 2D-based EDA tool.

8. A computer program product embodied on a non-transitory computer readable medium, the non-transitory computer readable medium having stored thereon a sequence of instructions which, when executed by a processor, executes a method comprising:

generating an electronic design for a three-dimensional integrated circuit (3D-IC);

unfolding a three-dimensional (3D) placed design to create an unfolded design having a two-dimensional (2D) representation, wherein the unfolded design comprises a die interface model between a first die and a second die, the die interface model comprises a zero delay module implemented using an interface logic model (ILM), and the die interface model corresponds to an interface component to be manufactured to connect the first die and the second die; and performing concurrent analysis on the 2D representation of the 3D-IC using an electronic design automation (EDA) tool, wherein the concurrent analysis analyzes the first die in conjunction with analysis of the second die.

9. The computer program product of claim 8, wherein the ILM comprises an input/output (I/O) net without logic components for each pin pair between the first die and the second die.

10. The computer program product of claim 8, wherein the concurrent analysis comprises at least one of timing analysis, power planning, clock tree synthesis, optimization, placement, or routing.

11. The computer program product of claim 10, wherein the timing analysis is performed by stitching together loads between the first die and the second die comprising a first load from the first die, a second load from the second die, and a third load from the die interface model.

12. The computer program product of claim 8, wherein the die interface model comprises an annotation for resistance/capacitance (RC) characteristics of a feedthrough net between the first die and the second die.

13. The computer program product of claim 8, wherein the die interface model corresponds to a bump, a micro-bump, a hybrid-bond, or a through-silicon via (TSV).

14. The computer program product of claim 8, wherein the concurrent analysis on the 2D representation of the 3D-IC is performed using a 2D-based EDA tool.

15. A system, comprising:

a processor;

a memory for holding programmable code; and wherein the programmable code includes instructions executable by the processor for generating an electronic design for a three-dimensional integrated circuit (3D-IC); unfolding a three-dimensional (3D) placed design to create an unfolded design having a 2D representation, wherein the unfolded design comprises a die interface model between a first die and a second die, the die interface model comprises a zero delay module implemented using an interface logic model (ILM), and the die interface model corresponds to an interface component to be manufactured to connect the first die and the second die; and performing concurrent analysis on the 2D representation of the 3D-IC using an electronic design automation (EDA) tool, wherein the concurrent analysis analyzes the first die in conjunction with analysis of the second die.

16. The system of claim 15, wherein the ILM comprises an input/output (I/O) net without logic components for each pin pair between the first die and the second die.

17. The system of claim 15, wherein the concurrent analysis comprises at least one of timing analysis, power planning, clock tree synthesis, optimization, placement, or routing.

18. The system of claim 17, wherein the timing analysis is performed by stitching together loads between the first die and the second die comprising a first load from the first die, a second load from the second die, and a third load from the die interface model.

19. The system of claim 15, wherein the die interface model comprises an annotation for resistance/capacitance (RC) characteristics of a feedthrough net between the first die and the second die.

20. The system of claim 15, wherein the concurrent analysis on the 2D representation of the 3D-IC is performed using a 2D-based EDA tool.

* * * * *